United States Patent
Zhou et al.

(10) Patent No.: US 10,410,909 B2
(45) Date of Patent: Sep. 10, 2019

(54) WAFFER PEDESTAL AND SUPPORT STRUCTURE THEREOF

(71) Applicant: PIOTECH CO., LTD., Shenyang (CN)

(72) Inventors: Ren Zhou, Shenyang (CN); Xuyen Pham, Shenyang (CN); Shichai Fang, Shenyang (CN)

(73) Assignee: PIOTECH CO., LTD., Shenyang (CN)

( * ) Notice: Subject to any disclaimer, the term of this patent is extended or adjusted under 35 U.S.C. 154(b) by 0 days.

(21) Appl. No.: 16/132,780

(22) Filed: Sep. 17, 2018

(65) Prior Publication Data

US 2019/0096736 A1   Mar. 28, 2019

(30) Foreign Application Priority Data

Sep. 22, 2017 (CN) .......................... 2017 1 0862974

(51) Int. Cl.
*H01L 21/687* (2006.01)
*H01L 21/67* (2006.01)
*H01L 21/677* (2006.01)

(52) U.S. Cl.
CPC .. *H01L 21/68714* (2013.01); *H01L 21/67103* (2013.01); *H01L 21/6875* (2013.01); *H01L 21/68785* (2013.01); *H01L 21/67109* (2013.01); *H01L 21/67766* (2013.01); *H01L 21/67778* (2013.01)

(58) Field of Classification Search
CPC ......... H01L 21/68714; H01L 21/67103; H01L 21/68785; H01L 21/6875; H01L 21/67109; H01L 21/67778; H01L 21/67766

See application file for complete search history.

(56) References Cited

U.S. PATENT DOCUMENTS

| | | | | |
|---|---|---|---|---|
| 8,753,923 B2* | 6/2014 | Kobayashi | ............. | H01L 21/78 438/113 |
| 8,863,808 B2* | 10/2014 | Yuki | ................ | H01L 21/67092 156/580 |
| 9,028,649 B2* | 5/2015 | Nakazawa | ........ | H01L 21/67132 156/707 |
| 2002/0192370 A1* | 12/2002 | Metzner | ................ | C23C 16/407 427/248.1 |
| 2004/0037206 A1* | 2/2004 | Shinoda | .................... | C03C 3/12 369/125 |
| 2005/0180293 A1* | 8/2005 | Ueyama | ............... | G11B 7/0903 369/112.05 |
| 2008/0007737 A1* | 1/2008 | Sekiya | ................... | B23K 26/53 356/614 |

(Continued)

*Primary Examiner* — John P. Dulka
(74) *Attorney, Agent, or Firm* — Tim Tingkang Xia, Esq.; Locke Lord LLP

(57) ABSTRACT

The invention discloses a support structure for a wafer pedestal; particularly the wafer pedestal has a wafer carrying surface defining holes for accommodation of the support structure. The support structure includes a first surface and extends therebetween. The first surface includes a rising portion for supporting wafer. A center of the first surface and a center of the second surface define an axis that is not parallel to the normal of the first surface. That is, the first surface extends oblique relatively to the second surface such that the support structure according to the invention can be received in the pedestal in an oblique way relative to the wafer carrying surface of the pedestal.

9 Claims, 4 Drawing Sheets

(56) References Cited

U.S. PATENT DOCUMENTS

| | | | | |
|---|---|---|---|---|
| 2010/0044359 A1* | 2/2010 | Sawabe | .................. | B23K 26/03 |
| | | | | 219/121.83 |
| 2013/0183811 A1* | 7/2013 | Kobayashi | .............. | H01L 21/78 |
| | | | | 438/463 |
| 2016/0372349 A1* | 12/2016 | Hyakumura | ...... | H01L 21/67092 |
| 2017/0154768 A1* | 6/2017 | Zhao | ................. | H01L 21/02076 |
| 2018/0350651 A1* | 12/2018 | Zhao | ................... | H01L 21/6836 |
| 2019/0096676 A1* | 3/2019 | Zhao | ................... | B23K 26/702 |

\* cited by examiner

WAFFER PEDESTAL AND SUPPORT STRUCTURE THEREOF

CROSS-REFERENCE TO RELATED APPLICATIONS

This non-provisional application claims priority under 35 U.S.C. § 119(a) on Patent Application No(s). 201710862974.4 filed in China on Sep. 22, 2017, the entire contents of which are hereby incorporated by reference.

BACKGROUND

Technical Field

The present invention relates to a heating pedestal adapted for a wafer processing apparatus, particularly to a heating pedestal having a support structure for supporting wafer on the pedestal.

Description of Related Art

In general, wafer processing apparatus is a multiple functioned apparatus constituted by several units that respectively perform different processes, such as gas supply device, gas exhaust device, load lock chamber, wafer transfer chamber and processing chamber. Each unit may be configured to have specific capability for various manufacture demands. For example, the gas supply device may be equipped with an electrode for PECVD, while the processing chamber may be equipped with heating source to perform wafer thermal treatment.

In the conventional semiconductor depositing process for forming thin films, a robotic arm of a transfer chamber places a wafer to be processed on a heating pedestal, and then the chemical deposition is conducted to form films on the wafer while the wafer is heated. A support structure is provided between the heating pedestal and the wafer to support the wafer in place above the heating pedestal. In a known configuration, the heating pedestal is a combination of a heating unit and a wafer carrier or a susceptor. For example, a resistive heating unit can be embedded within a wafer carrier thereby transferring heat to the wafer placed on the carrier. So far, the wafer support structure may be a sapphire ball or a ceramic pin that are vertically received in vertically extended through holes formed on the wafer carrier. There is a drawback in such structural configuration, that is, when a chamber is being vacuumed the support structure can possibly be pulled out of the holes due to lack of other structural restriction during gas exhausting process. Furthermore, when unloading a heated wafer from the environment of high temperature, the support structure (e.g. crystal ball or ceramic pin) may be undesirably adhered to a bottom surface of the wafer and left the processing chamber with the wafer by a robotic arm, which could affect the quality of final product.

Accordingly, there is a need to develop a technique that improves the engagement of the support structure and the heating pedestal or wafer carrier in order to avoid the support structure detached from the pedestal during wafer process.

SUMMARY

An object of the present invention is to provide a support structure for a wafer pedestal, the wafer pedestal having a wafer carrying surface defining a hole for accommodation of the support structure. The support structure includes a body having a first surface and a second surface, the body extending between the first surface and the second surface, and the first surface including a rising portion. Wherein, a center of the first surface and a center of the second surface defines an axis which is not parallel to the normal of the first surface.

In one preferred embodiment, the extending of the body defines the axis, the axis and its vertical projection component with respect to the first surface define a angle in a range from 15 to 45 degrees.

In one preferred embodiment, the body includes a cap and an elongated portion extending from the cap, the cap includes the first surface and the elongated portion includes the second surface, a radial size of the cap is larger than that of the elongated portion.

In one preferred embodiment, the body has continuously various thicknesses.

Another object of the present invention is to provide a wafer pedestal adapted for wafer processing apparatus. The wafer pedestal includes a carrying surface defining a plurality of accommodation holes, each of the plurality of accommodation holes containing a support structure for supporting a wafer, the support structure including a body having a first surface and a second surface, the body extending between the first surface and the second surface. Wherein, the first surface of the body of the support structure includes a rising portion, a center of the first surface and a center of the second surface defines an axis which is not parallel to the normal of the carrying surface.

In one preferred embodiment, the body includes a cap and an elongated portion extending from the cap, the cap includes the first surface and the elongated portion includes the second surface, a radial size of the cap is larger than that of the elongated portion.

In one preferred embodiment, each of the plurality of accommodation holes includes a first segment and a second segment extending from the first segment, the first segment receives the cap of the support structure and the second segment receives the elongated portion of the support structure.

In one preferred embodiment, the first segment has continuously various depths.

In one preferred embodiment, the plurality of accommodation holes is arranged symmetrically over the carrying surface.

The foregoing and other features and advantages of the present disclosure will be described in detail in the following detailed descriptions of several embodiments as well as in the accompanying drawings illustrating the principles of the invention.

BRIEF DESCRIPTION OF THE DRAWINGS

Aspects of the disclosure can be better understood with reference to the following drawings. Non-limiting and non-exhaustive embodiments are described with reference to the following drawings. The components in the drawings are not necessarily to scale, with the emphasis instead being placed upon illustrating the structure and principles of the invention.

DETAILED DESCRIPTION

The present disclosure will be fully described with reference to the drawings showing illustrated embodiments of the invention. However, given that this claimed subject matter can be achieved through various forms, the construction of the subject matter being covered or filed is not limited to any illustrated embodiments disclosed herein, which are merely illustrative. Similarly, the present disclosure aims to provide a reasonably wide scope to the claimed subject matter being filed or covered. Furthermore, illustrated embodiments of the claimed subject matter can be, for example, a method, a device or a system. Therefore, these embodiments may be implemented in hardware, software, firmware or any form of combination thereof (which is, as it is known, not software).

Appearances of the phrase "in one embodiment" herein are not necessarily referring to the same embodiment, and appearances of the phrase "in other embodiments" herein are not necessarily referring to a different embodiment. This for the purpose of, for example, stating that the claimed subject matter includes combinations of all or part of the illustrated embodiments.

Figure 1:
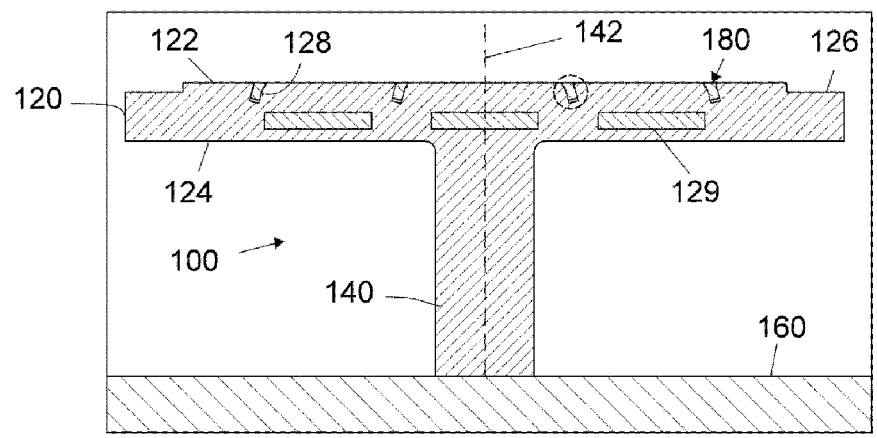
FIG. 1 is a schematic view illustrating a wafer pedestal in accordance with an embodiment of the present invention.

FIG. 1 illustrates a wafer pedestal (100) according to the present invention for use in the semiconductor processing chamber, where the wafer pedestal (100) includes a wafer carrier (120) and a pillar (140) that could be formed integratedly with identical materials. The carrier (120) has a carrying surface (122) and a bottom surface (124), wherein the carrying surface (122) is used for carrying a work piece (not shown), such as a wafer or a substrate to be processed. For example, a wafer to be processed is transferred by a robotic arm to a processing chamber of a semiconductor manufacturing apparatus and placed properly above the carrying surface (122). The bottom surface (124) of the carrier (120) is joined to the pillar (140). The carrier (120) has a thickness extending between the carrying surface (122) and the bottom surface (124).

The wafer carrier (120) has a ledge (126) positioned lower than the carrying surface (122) in order to engage with a ceramic ring (not shown) for other processing purposes. In other embodiments, the carrier (120) lacks said ledge.

The pillar (140) is substantially a cylinder member extending from the bottom surface (124) of the carrier (120). In general, a distal end of the pillar (140) is coupled to a bottom (160) of the processing chamber by a known technique. In one embodiment, the pillar (140) may be coupled to a cooling device that connects to the processing chamber. An extension of the pillar (140) determines a center axis (142). The material of the wafer carrier (120) and the pillar (140) may be ceramic.

The wafer carrier (120) includes a plurality of accommodation holes (128) defined on the carrying surface (122). In one embodiment, these accommodation holes (128) has substantially the same volume, and each of the accommodation holes (128) is configured to receive a support structure (180) for supporting a wafer. The accommodation hole (128) extends downward from the carrying surface (122) based on an angle with respect to the carrying surface (122). Said angle is not equal to ninety degrees. In other words, these accommodation holes (128) do not extend in a direction parallel to the normal direction of the carrying surface (122). Yet as illustrated, all extending directions of the accommodation holes (128) point to a center position above the carrying surface (122), such as a position along the center axis (142). One or more accommodation holes (128) may be included over the carrying surface (122) along a lateral direction. In other embodiments, these accommodation holes (128) may have different angles or oblique arrangements. These accommodation holes (128) may be in a circular arrangement with respect to the center axis (142), and all of the accommodation holes (128) has same obliqueness with respect to the center axis (142).

Figure 2:
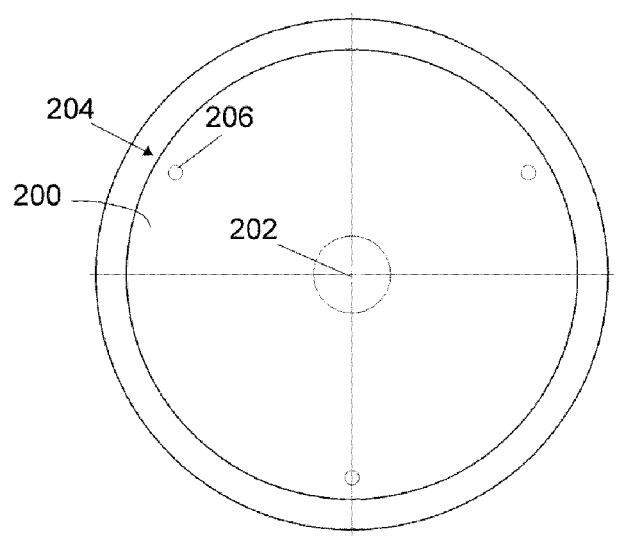
FIG. 2 is a top view illustrating a carrier surface of the pedestal according to FIG. 1.

FIG. 2 is a top view of the wafer carrier according to one embodiment of the present invention, in which an arrangement on the carrying surface (200) is illustrated. As can be seen in FIG. 2, the carrying surface (200) is substantially circular with a center (202). Three accommodation holes (204) are provided at a radial distance from the center (202) and are equally separated with one another. In other embodiments, a greater number of the accommodation holes (204) may be included over the carrying surface (200) with said support structure received therein.

Referring to FIG. 1, each of the accommodation holes (128) receives a support structure (180) for supporting a wafer to be processed. In one embodiment, these support structures (180) are of substantially the same size and material such that the support structures (180) can be maintained at the same level relatively to the carrying surface (122) when received in the accommodation holes (128). Referring to FIG. 2, in one embodiment, the carrying surface (122) is equipped with three support structures (206). In other embodiments, a greater number of the support structures can be used.

Figure 3:
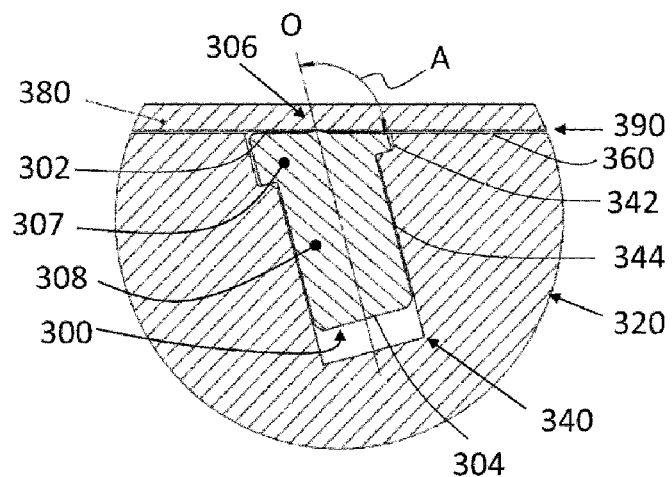
FIG. 3 is an enlarged view illustrating a wafer being supported in accordance with an embodiment of the present invention.

FIG. 3 is an enlarged view according to FIG. 1, illustrating a cross segment of a support structure (300) received in an accommodation hole (340) of a pedestal (320). A portion of the support structure (300) protrudes from the carrying surface (360). A bottom surface of a wafer or substrate (380) is supported by the protruding portion of the support structure (300) such that a gap (390) is formed between the wafer and the carrying surface (360). The wafer is able to be laid above the carrying surface (360) without contacting the carrying surface (360) when the support structures (300) are maintained at a consistent height. As stated above, the accommodation hole (340) extends downward at an angle from the carrying surface (360) and terminates at a depth. The accommodation hole (340) has a first segment (342) adjacent to the carrying surface (360) with a continuously varying vertical depth and a second segment (344) extending downwardly at an angle from the first segment (342). As illustrated, the first segment (342) has a laterally extending width larger than that of the second segment (344). The first segment (342) has a vertically extending depth that is smaller than that of the second segment (344). Walls defining the first segment (342) are parallel to the walls defining the second segment (344). The first segment (342) has a smaller volume than that of the second segment (344). Though not shown in the drawing, the accommodation hole (340) can be a circular hole or rectangular hole. The first segment (342) and the second segment (344) can be identically or differently shaped holes. In other embodiments, ratios regarding the widths, depths or volumes may also be considered and selected.

The support structure (300) includes a body having and extending between a first surface (302) and a second surface (304). The direction in which the body extends defines an orientation axis of the support structure (300). Alternatively, a center of the first surface (302) of the body and a center of the second surface (304) of the body define an orientation axis of the body, and the orientation axis is not parallel to the normal direction (i.e. the direction perpendicular to the surface) of the first surface (302). As illustrated, the support structure (300) defines an orientation axis (O) substantially parallel to the direction in which the body extends. As illustrated, the orientation axis (O) passes through and is perpendicular to the center of the second surface (304). The orientation axis (O) substantially passes through and is not perpendicular to the normal direction of the first surface (302). The first surface (302) and the second surface (304) are not parallel to each other. The first surface (302) is tilted at an angle relative to the second surface (304). The first surface (302) of the support structure (300), when well received, is parallel to the carrying surface (360) while the second surface (304) is tilted at an angle relative to the carrying surface (360). In this case, the orientation axis (O) of the body is not parallel to the normal direction of the carrying surface (360).

Figure 4:
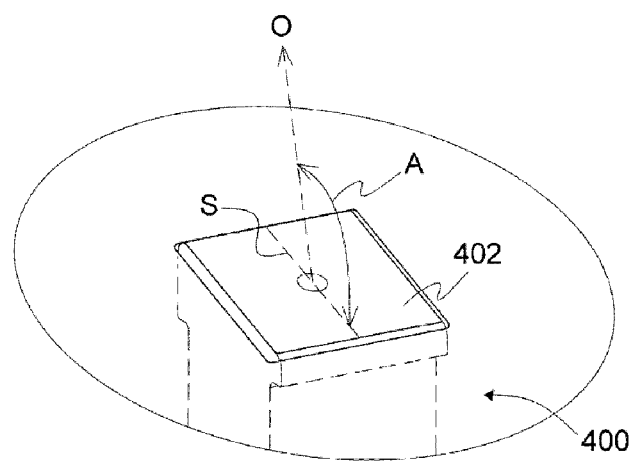
FIG. 4 is a perspective top view illustrating a support structure after installed in accordance with an embodiment of the present invention.
Figure 5A:
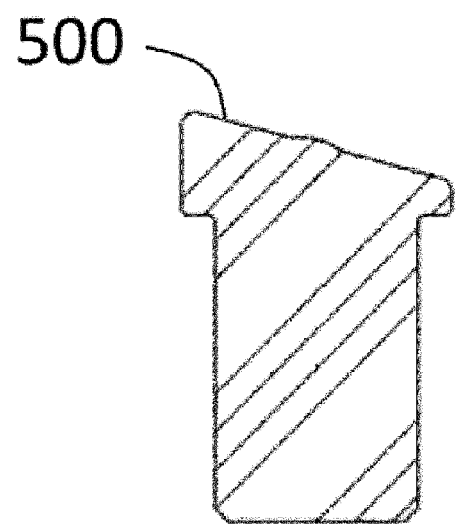
FIGS. 5A and 5B are respectively a cross-segmental view and a top view of a support structure in accordance with one embodiment of the present invention.
Figure 5B:
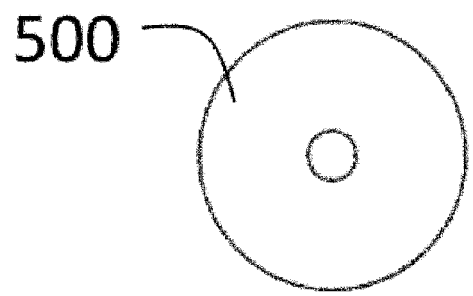
Figure 5C:
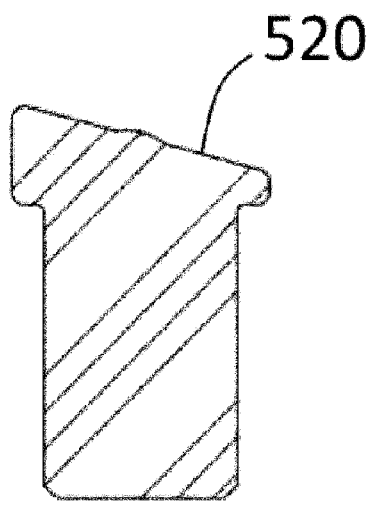
FIGS. 5C and 5D are respectively a cross-segmental view and a top view of a support structure in accordance with another embodiment of the present invention.
Figure 5D:
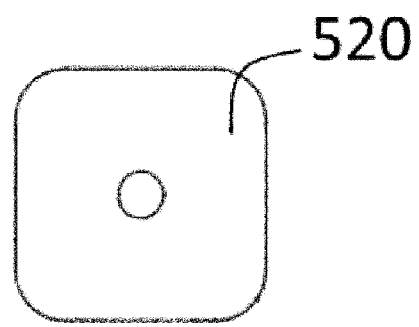

The extension of the body of the support structure (300) determines said orientation axis which defines an angle relative to the first surface or the carrying surface. As illustrated in FIG. 3, an angle (A) is formed between the orientation axis (O) and the first surface (302) or the carrying surface (360). More specifically, the angle (A) is defined by the orientation axis (O) and a line of symmetry on the first surface (302) of the support structure (300). FIG. 4 is an enlarged perspective view showing a support structure (400) according to the present invention that is inserted into an accommodation hole and exposes its first surface (402). As illustrated, the line of symmetry (S) can be defined on the first surface (402) according to the structural symmetry of the support structure (400). That is, a pair of identical cross-sectional areas can be obtained according to the line of symmetry (S). Said angle (A) is defined by the orientation axis (O) of the support structure (400) and the line of symmetry (S) of the support structure (400). Alternatively, the orientation axis (O) and its projection portion on the first surface (302) define said angle (A). Similarly, in FIG. 3, the orientation axis (O) of the support structure (300) and its projection portion on the first surface (302) can also define the angle (A). In one embodiment, the angle (A) ranges from 15 to 45 degrees. In other embodiments, the angle (A) ranges from 105 to 135 degrees. The value of the angle (A) reflects the extent of obliqueness for the received support structure relative to the carrying surface.

Referring to FIG. 3, the support structure (300) includes a protrusion member (306) formed on the first surface (302). The protrusion member (306) is configured to come into contact with the wafer (380) to lift the wafer above the carrying surface (360). The support structure that includes the protrusion member according to the present invention can be made of ceramic. However, in other embodiments, the body and the protrusion member of the support structure may be made of different materials.

Further referring to FIG. 3, the support structure (300) includes a cap (307) and an elongated portion (308) obliquely extending downward from the cap (307). The cap (307) and the elongated portion (308) are properly shaped and sized so as to fit into the accommodation hole (340) and substantially fill the first segment (342) and the second segment (344). The cap (307) includes the first surface (302) and the elongated portion (308) includes the second surface (304). The cap (307) has a radial size larger than that of the elongated portion (308). As illustrated, the cap (307) has a width larger than that of the elongated portion (308). The cap (307), when received, sits on a shoulder defining the first segment (342) and the second segment (344) and is kept from going into the second segment (344). The elongated portion (308) enters into the second segment (344) of the accommodation hole (340) and comes properly into contact with the walls of the second segment (344) in order to keep the support structure (300) from being pulled out of the accommodation hole (340) easily. As illustrated, the depth of the second segment (344) of the accommodation hole (340) is generally larger than a predetermined length of the elongated portion (308) of the support structure (300). This is to create more space within the accommodation hole to avoid the elongated portion of the support structure from hitting the bottom of the hole. The cap according to the present invention has a continuously varying thickness. As illustrated, the cap (307) has a continuously varying thickness extending between the first surface (302) and the elongated portion (308). The thickness of the support structure (300) varies, going from thick to thin, along a lateral direction, such as a lateral direction as shown in FIG. 3 or the direction of the line of symmetry (S) in FIG. 4. The extent at which the thickness varies can reflect the extent of the obliqueness of the received support structure. As illustrated, the cap (307) of the received support structure (300) and its peripheral walls may form a gap therebetween while the elongated portion (308) almost comes into contact with its peripheral walls.

Referring to FIG. 1, the pedestal (100) further provides means for heating, such as one or more heating units (129) embedded within the thickness of the wafer carrier (120), and separated from the accommodation holes (128) by a proper distance. The heating units (129) can be heating wires or other power-controlled resistive heating components. As such, the pedestal (100) is capable of generating and transmitting heat to carry out a heating process using the semiconductor processing apparatus. Conventionally, the protrusion of the support structure may adhere to the bottom of wafer during a heating process through physical or chemical reactions, which generates a force pulling the support structure out of the accommodation hole when the wafer is lifted from the wafer carrier. The oblique design of the support structure according to the present invention increases the vertical friction and restriction thereof. As illustrated in FIG. 3, an outer surface of the elongated portion (308) of the support structure (300) is able to come completely into contact with the wall defining the accommodation hole (340). In the case where a pulling force acting on the support structure forms an angle with its contacting surface due to the oblique structure, the resulting friction on the contacting surface is much greater than that on a contacting surface whose normal direction is parallel to the pulling force. It is thus more difficult for the support structure (300) to be pulled out of the accommodation hole. In this regard, using the support structure and the wafer carrier having the same is able to overcome the drawback of prior art, so that the quality of wafer products can be improved.

Although certain details have been used to describe the present disclosure for a better understanding, it will be appreciated that certain changes and modifications may be made thereto within the scope of the claims. Therefore, the foregoing embodiments are merely exemplary and are not intended to limit the present disclosure. Also, the present disclosure is not limited by the details in the description herein, but allows to be modified within the scope of the appended claims and their equivalents.

What is claimed is:

1. A support structure for a wafer pedestal, the wafer pedestal having a wafer carrying surface defining a hole for accommodation of the support structure, the support structure comprising:
   a body, having a first surface and a second surface, the body extending between the first surface and the second surface, and the first surface including a rising portion, characterized in that:
   a center of the first surface and a center of the second surface defines an axis which is not parallel to the normal of the first surface.

2. The support structure of claim 1, wherein the extending of the body defines the axis, the axis and its vertical projection component with respect to the first surface define a angle in a range from 15 to 45 degrees.

3. The support structure of claim 1, wherein the body includes a cap and an elongated portion extending from the cap, the cap includes the first surface and the elongated portion includes the second surface, a radial size of the cap is larger than that of the elongated portion.

4. The support structure of claim 3, wherein the body has continuously various thicknesses.

5. A wafer pedestal adapted for wafer processing apparatus, the wafer pedestal comprising:
   a carrying surface defining a plurality of accommodation holes, each of the plurality of accommodation holes containing a support structure for supporting a wafer, the support structure comprising a body having a first surface and a second surface, the body extending between the first surface and the second surface, characterized in that:
   the first surface of the body of the support structure includes a rising portion, a center of the first surface and a center of the second surface defines an axis which is not parallel to the normal of the carrying surface.

6. The wafer pedestal of claim 5, wherein the body includes a cap and an elongated portion extending from the cap, the cap includes the first surface and the elongated portion includes the second surface, a radial size of the cap is larger than that of the elongated portion.

7. The wafer pedestal of claim 6, wherein each of the plurality of accommodation holes includes a first segment and a second segment extending from the first segment, the first segment receives the cap of the support structure and the second segment receives the elongated portion of the support structure.

8. The wafer pedestal of claim 7, wherein the first segment has continuously various depths.

9. The wafer pedestal of claim 5, wherein the plurality of accommodation holes is arranged symmetrically over the carrying surface.

* * * * *